United States Patent
Hafez et al.

(10) Patent No.: US 9,786,783 B2
(45) Date of Patent: Oct. 10, 2017

(54) TRANSISTOR ARCHITECTURE HAVING EXTENDED RECESSED SPACER AND SOURCE/DRAIN REGIONS AND METHOD OF MAKING SAME

(71) Applicant: INTEL CORPORATION, Santa Clara, CA (US)

(72) Inventors: Walid M. Hafez, Portland, OR (US); Joodong Park, Portland, OR (US); Jeng-Ya D. Yeh, Portland, OR (US); Chia-Hong Jan, Portland, OR (US); Curtis Tsai, Beaverton, OR (US)

(73) Assignee: INTEL CORPORATION, Santa Clara, CA (US)

( * ) Notice: Subject to any disclaimer, the term of this patent is extended or adjusted under 35 U.S.C. 154(b) by 132 days.

(21) Appl. No.: 13/995,717

(22) PCT Filed: Mar. 29, 2013

(86) PCT No.: PCT/US2013/034705
§ 371 (c)(1),
(2) Date: Jun. 19, 2013

(87) PCT Pub. No.: WO2014/158198
PCT Pub. Date: Oct. 2, 2014

(65) Prior Publication Data
US 2014/0291737 A1    Oct. 2, 2014

(51) Int. Cl.
*H01L 29/78* (2006.01)
*H01L 29/66* (2006.01)

(52) U.S. Cl.
CPC ...... *H01L 29/785* (2013.01); *H01L 29/66477* (2013.01); *H01L 29/66795* (2013.01); *H01L 29/78* (2013.01)

(58) Field of Classification Search
CPC ..................................................... H01L 29/785
(Continued)

(56) References Cited

U.S. PATENT DOCUMENTS

| 8,143,668 B2 * | 3/2012 | Morita | H01L 21/823814 |
|---|---|---|---|
| | | | 257/330 |
| 2003/0085424 A1 * | 5/2003 | Bryant | H01L 21/84 |
| | | | 257/347 |

(Continued)

FOREIGN PATENT DOCUMENTS

| CN | 102386226 A | 3/2012 |
|---|---|---|
| JP | H03156976 A | 7/1991 |

(Continued)

OTHER PUBLICATIONS

International Search Report and Written Opinion received for PCT Patent Application No. PCT/US2013/034705, mailed Jan. 14, 2014, 12 pages.

(Continued)

*Primary Examiner* — Mark Prenty
(74) *Attorney, Agent, or Firm* — Finch & Maloney PLLC (57) ABSTRACT

Techniques are disclosed for forming transistor architectures having extended recessed spacer and source/drain (S/D) regions. In some embodiments, a recess can be formed, for example, in the top of a fin of a fin-based field-effect transistor (finFET), such that the recess allows for forming extended recessed spacers and S/D regions in the finFET that are adjacent to the gate stack. In some instances, this configuration provides a higher resistance path in the top of the fin, which can reduce gate-induced drain leakage (GIDL) in the finFET. In some embodiments, precise tuning of the onset of GIDL can be provided. Some embodiments may provide a reduction in junction leakage ($L_b$) and a simultaneous increase in threshold voltage ($V_T$). The disclosed techniques can be implemented with planar and non-planar (Continued)

fin-based architectures and can be used in standard metal-oxide-semiconductor (MOS) and complementary MOS (CMOS) process flows, in some embodiments.

25 Claims, 7 Drawing Sheets (58) Field of Classification Search
USPC .......................................................... 257/288
See application file for complete search history.

(56) References Cited

U.S. PATENT DOCUMENTS

| | | | |
|---|---|---|---|
| 2004/0075137 A1* | 4/2004 | Lin ....................... H01L 27/115 | |
| | | | 257/332 |
| 2005/0173768 A1* | 8/2005 | Lee ..................... H01L 29/4908 | |
| | | | 257/401 |
| 2005/0274994 A1* | 12/2005 | Rhodes ............. H01L 27/14603 | |
| | | | 257/291 |
| 2006/0138477 A1* | 6/2006 | Suh ................... H01L 27/10876 | |
| | | | 257/288 |
| 2006/0189043 A1 | 8/2006 | Schulz | |
| 2008/0048262 A1 | 2/2008 | Lee et al. | |
| 2009/0142897 A1 | 6/2009 | Chau et al. | |
| 2011/0227157 A1* | 9/2011 | Yang et al. .................... 257/347 | |
| 2011/0272739 A1 | 11/2011 | Lee et al. | |
| 2012/0049249 A1* | 3/2012 | Zhu ................... H01L 21/76224 | |
| | | | 257/288 |
| 2013/0062669 A1* | 3/2013 | Chen ..................... H01L 29/401 | |
| | | | 257/288 |
| 2013/0244006 A1* | 9/2013 | Ebnoether ..................... 428/166 | |
| 2014/0138779 A1* | 5/2014 | Xie ................... H01L 29/66545 | |
| | | | 257/401 |
| 2014/0264479 A1* | 9/2014 | Cai ....................... H01L 29/401 | |
| | | | 257/288 |

FOREIGN PATENT DOCUMENTS

| | | | |
|---|---|---|---|
| JP | 2004-119644 A | | 4/2004 |
| JP | 2010-527153 A | | 8/2010 |
| KR | 10-2005-0079270 A | | 8/2005 |
| KR | 10-2008-0029660 A | | 4/2008 |
| KR | 1020060096535 | * | 4/2008 |
| KR | 1020080029660 | * | 4/2008 |
| KR | 10-2010-0102861 A | | 9/2010 |
| KR | 10-2011-0049090 A | | 5/2011 |
| TW | 201030820 A | | 8/2010 |
| TW | 201119031 A | | 6/2011 |

OTHER PUBLICATIONS

Office Action including Taiwan IPO Search Report received in Taiwan Patent Application No. 103111026, dated Mar. 18, 2016, 14 pages.
Taiwan Office Action (including TW Search Report and English Translation) received for TW Application No. 105126392 dated Dec. 23, 2016. 13 pages.
Notification of Reasons for Refusal for related Japanese Application No. 2016-5054550, mailed on Mar. 13, 2017, 5 pages.

* cited by examiner

TRANSISTOR ARCHITECTURE HAVING EXTENDED RECESSED SPACER AND SOURCE/DRAIN REGIONS AND METHOD OF MAKING SAME

BACKGROUND

Integrated circuit (IC) design in the deep-submicron process nodes (e.g., 32 nm and beyond) involves a number of non-trivial challenges, and transistor structures have faced particular complications, such as those with respect to achieving low-power performance. Continued process scaling will tend to exacerbate such problems.

BRIEF DESCRIPTION OF THE DRAWINGS

FIG. 6' is a cross-sectional perspective view of the IC of FIG. 6.

FIG. 6" is a cross-sectional view taken along dotted line A-A in FIG. 6'.

FIG. 8' is an expanded view of the portion of FIG. 8 enclosed by the dashed ellipse contained therein.

These and other features of the present embodiments will be understood better by reading the following detailed description, taken together with the figures herein described. In the drawings, each identical or nearly identical component that is illustrated in various figures may be represented by a like numeral. For purposes of clarity, not every component may be labeled in every drawing. Furthermore, as will be appreciated, the figures are not necessarily drawn to scale or intended to limit the described embodiments to the specific configurations shown. For instance, while some figures generally indicate straight lines, right angles, and smooth surfaces, an actual implementation of the disclosed techniques may have less than perfect straight lines, right angles, etc., and some features may have surface topology or otherwise be non-smooth, given real world limitations of fabrication processes. In short, the figures are provided merely to show example structures.

DETAILED DESCRIPTION

Techniques are disclosed for forming transistor architectures having extended recessed spacer and source/drain (S/D) regions. In some embodiments, a recess can be formed, for example, in the top of a fin of a fin-based field-effect transistor (finFET), such that the recess allows for forming extended recessed spacers and S/D regions in the finFET that are adjacent to the gate stack. In some instances, this configuration provides a higher resistance path in the top of the fin, which accordingly may help to minimize or otherwise reduce gate-induced drain leakage (GIDL) in the finFET. In some embodiments, precise tuning of the onset of GIDL can be provided. In some cases, a transistor architecture configured as described herein may demonstrate a reduction in junction leakage ($L_b$) while simultaneously exhibiting an increase in threshold voltage ($V_T$). The disclosed techniques can be implemented with planar and non-planar fin-based architectures and can be used in standard metal-oxide-semiconductor (MOS) and complementary MOS (CMOS) process flows, in some embodiments. Numerous configurations and variations will be apparent in light of this disclosure.

General Overview

As previously indicated, there are a number of non-trivial issues that can arise which complicate the ability to achieve low-power performance from transistors in the deep-submicron process nodes (e.g., 32 nm and beyond). For instance, one non-trivial issue pertains to the fact that metal-oxide-semiconductor field-effect transistors (MOSFETs) typically experience several different types of current leakage, including gate leakage, off-state (or sub-threshold) current leakage, and junction leakage, each of which can negatively impact the ability to achieve low-power transistor performance. Of these various types of leakage, junction leakage is one of the primary leakage components, and gate-induced drain leakage (GIDL) is a dominant form of junction leakage, particularly so in the context of fin-based field-effect transistor (finFET) architectures.

Traditional approaches to addressing junction leakage include junction grading, co-implant optimization, and oxide thickness control, but each has significant negative consequences due to increasing sub-threshold (off-state) leakage. Increasing the oxide thickness to lower gate leakage comes at the expense of loss of short-channel control. Wider gate lengths may be provided to lower off-state/sub-threshold current leakage, but unbounded lateral scaling often requires the off-state/sub-threshold current to be reduced through higher threshold voltages ($V_T$). The high halo doses required to sufficiently increase $V_T$ and to compensate for the loss of short-channel control due to an increase in oxide thickness (for gate leakage) and sub-threshold current (due to shorter gate lengths) normally create sharp doping profiles between the source/drain (S/D) and body of the transistor. In some cases, junction leakage can be mitigated through modification of the doping profiles between the body/channel and S/D regions, and $V_T$ may be increased to control short-channel effects (e.g., particularly in low-power devices on a scaled technology where short gate lengths yield high off-state current). However, as compared to a planar architecture, finFETs generally exhibit a reduced sensitivity to $V_T$ control for a given halo dose, thus requiring a higher implant to increase the transistor $V_T$, in turn exacerbating junction leakage performance problems for such a transistor architecture. Another non-trivial issue pertains to the fact that process technologies scaling to higher performance generally do so at the expense of leakage. In particular, shorter gate lengths require more halo dosing to control short-channel behavior (off-state current), and as a result, the junction leakage is increased, hindering the ability to achieve low-power performance.

Thus, and in accordance with an embodiment of the present disclosure, techniques are disclosed for forming a transistor architecture having extended recessed spacer and source/drain (S/D) regions. In some embodiments, the disclosed techniques can be used, for example, to form a recess in the top of a fin of a fin-based field-effect transistor (finFET) in the S/D regions proximate the gate stack. In turn, such a recess may allow for forming extended recessed spacer and S/D regions in the finFET. In some instances, this configuration provides a higher resistance path in the top of the fin (e.g., where GIDL current normally is most dominant), which accordingly may help to minimize or otherwise reduce GIDL in the finFET.

In general, junction leakage in a transistor typically increases as $V_T$ increases. However, by introducing a recess in the top of the fin at the spacer and S/D region adjacent to the gate stack, the $V_T$ of the transistor can be increased without any increase (or with an otherwise negligible increase) in junction leakage, in some embodiments. In some cases, a transistor architecture configured as described herein may demonstrate a reduction in leakage to the body ($L_b$) (e.g., a reduction in junction leakage) while simultaneously exhibiting an increase in $V_T$. For instance, in an example case of a finFET having silicon (Si) fins, a tenfold or greater reduction in junction leakage can be realized while simultaneously providing an increase in $V_T$ in the range of about 100 mV (e.g., ±25%), as compared with existing architectures. As will be appreciated in light of this disclosure, and in accordance with other embodiments, the disclosed techniques can be used to provide other ranges and sub-ranges of improvements in $L_b$ and $V_T$, as desired for a given target application or end-use.

In some embodiments, the disclosed techniques can be used to provide for precise tuning of the onset of GIDL in a finFET architecture, which may help to reduce junction leakage for such finFET. Also, in some embodiments, junction leakage and off-state current may be lowered without changing the gate length as compared to conventional devices, which in turn may provide a scaling advantage for the techniques and architecture disclosed herein (e.g., as compared to existing approaches). In general, the techniques disclosed herein are primarily discussed, for example, in the context of finFET architectures (e.g., such as tri-gate and/or other three-dimensional/non-planar transistor architectures), in accordance with some embodiments. It should be noted, however, that the disclosed techniques are not so limited to implementation only with finFET architectures. For instance, in some other embodiments, the disclosed techniques can be used to minimize or otherwise reduce junction leakage in planar transistor architectures. In a more general sense, the disclosed techniques can be utilized, for example, in any standard and/or custom metal-oxide-semiconductor (MOS) or complementary MOS (CMOS) process flows, in accordance with one or more embodiments.

In some embodiments, the disclosed techniques can be used to provide low-power transistor architectures. In some instances, such architectures may find use in any of a wide variety of applications, such as in system-on-chip (SoC) applications, in embedded segments, and/or in power-sensitive electronic devices such as mobile phones, tablets, notebook computers, and other portable computing devices. In a more general sense, the disclosed techniques and architecture can be used in any application which might benefit from the use of low-power transistor structures. Numerous suitable uses and applications will be apparent in light of this disclosure. Also, and in accordance with an embodiment, use of the disclosed techniques may be detected, for example, by visual or other inspection (e.g., microscope, etc.) of a given IC or other device that has a transistor architecture including extended recessed S/D regions configured as described herein.

Methodology and Architecture

FIGS. 1-8 illustrate an integrated circuit (IC) fabrication process flow in accordance with an embodiment. Each of the views illustrated in FIGS. 1-8 is taken along a cross-section that is substantially orthogonal to the gate (e.g., an OGD cut). Turning now to the figures, the process flow begins as in FIG. 1, which is a cross-sectional side view of an IC 100 configured in accordance with an embodiment. As can be seen, IC 100 includes a substrate 110. Substrate 110 can have any configuration and thickness that is suitable to serve, for example, as a foundation upon which a semiconductor device (e.g., a transistor) may be built. In some cases, substrate 110 may be configured as a fin (e.g., of a fin-based field-effect transistor, or finFET, architecture). Also, substrate 110 can comprise any of a wide variety of materials, including: silicon (Si); germanium (Ge); a III-V material; and/or any other electrically conductive material suitable for forming a desired semiconductive channel for IC 100, as will be apparent in light of this disclosure. Furthermore, substrate 110 can be formed using any of a wide variety of processes, including: crystal growth; chemical vapor deposition (CVD); epitaxy; atomic layer deposition (ALD); and/or any combination thereof. Other suitable configurations, materials, and techniques for forming substrate 110 will depend on a given application and will be apparent in light of this disclosure.

Figure 1:
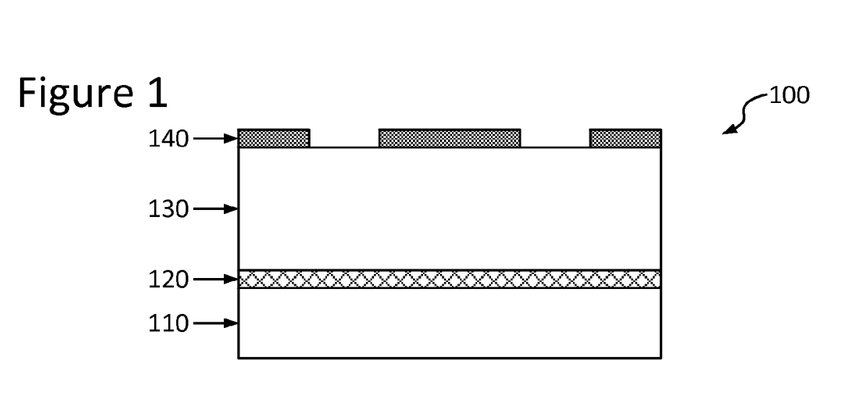
FIG. 1 is a cross-sectional side view of an integrated circuit (IC) configured in accordance with an embodiment.

Also, as can be seen from FIG. 1, a dummy gate oxide (DGO) layer 120 is provided over substrate 110. DGO layer 120 can have any desired configuration and thickness, and in some instances, may be provided as a substantially conformal layer over substrate 110. To that end, DGO layer 120 can be formed using any of a wide variety of processes, including: thermal growth; atomic layer deposition (ALD); chemical vapor deposition (CVD); and/or any combination thereof. Also, in some embodiments, DGO layer 120 can comprise, for example, an oxide such as silicon dioxide ($SiO_2$) and/or alumina ($Al_2O_3$). However, DGO layer 120 is not so limited in material composition, as in a more general sense, DGO layer 120 may be any insulator material which provides the desired amount of electrical isolation for a given target application or end-use, as will be apparent in light of this disclosure. As discussed below with reference to FIGS. 3 and 7, and in accordance with some embodiments, DGO layer 120 also can serve as a sacrificial layer, and in some instances can be used as an etch stop (e.g., while etching dummy gate layer 130, discussed below). In general, by selectively thinning or removing the DGO layer 120, the gate layer 130 etch can be controlled to break into the diffusion layer, thereby creating a recess 105 as described herein. Other suitable configurations, materials, and techniques for forming DGO layer 120 will depend on a given application and will be apparent in light of this disclosure.

As can further be seen from FIG. 1, a dummy gate layer 130 is provided over DGO layer 120. Dummy gate layer 130 can have any desired configuration and thickness, and in some instances, may be provided as a substantially conformal layer over DGO layer 120. To that end, dummy gate layer 130 can be formed using any of a wide variety of processes, including: chemical vapor deposition (CVD); epitaxy, such as liquid-phase epitaxy (LPE); and/or any combination thereof. Also, in some embodiments, dummy gate layer 130 can comprise, for example: polycrystalline silicon; amorphous silicon; a nitride, such as silicon nitride ($Si_3N_4$); and/or any other material which has sufficient resilience to serve as a dummy gate, as will be apparent in light of this disclosure. As discussed below with reference to FIG. 7, and in accordance with an embodiment, dummy gate layer 130 can serve as a sacrificial layer (e.g., it can be replaced by replacement metal gate, or RMG, layer 180, discussed below). Other suitable configurations, materials, and techniques for forming dummy gate layer 130 will depend on a given application and will be apparent in light of this disclosure.

As can further be seen, a hardmask layer 140 is provided over dummy gate layer 130. Hardmask layer 140 can have any desired configuration and thickness, and in some instances, may be provided as a substantially conformal layer over dummy gate layer 130. To that end, hardmask layer 140 can be formed, for example, using chemical vapor deposition (CVD) and/or any other process suitable for providing a layer of hardmask material, as will be apparent in light of this disclosure. Also, in some embodiments, hardmask layer 140 can comprise, for example, a nitride such as silicon nitride ($Si_3N_4$). However, hardmask layer 140 is not so limited in material composition, as in a more general sense, hardmask layer 140 may be any hardmask material having sufficient resilience for a given target application or end-use, as will be apparent in light of this disclosure. As illustrated in FIG. 1, and in accordance with an embodiment, hardmask layer 140 can be patterned. Any standard and/or custom patterning process can be utilized for patterning hardmask layer 140, as desired. Other suitable configurations, materials, and techniques for forming and patterning hardmask layer 140 will depend on a given application and will be apparent in light of this disclosure.

Figure 2:
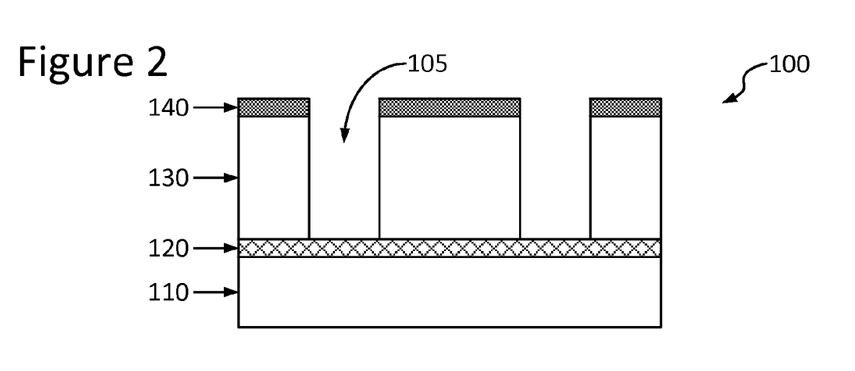
FIG. 2 is a cross-sectional side view of the IC of FIG. 1 after etching thereof, in accordance with an embodiment.

The process flow continues as in FIG. 2, which is a cross-sectional side view of the IC 100 of FIG. 1 after etching thereof, in accordance with an embodiment. As can be seen, as a result of the etching process, one or more recesses 105 are formed in dummy gate layer 130, for example, in the region(s) exposed during the patterning of hardmask layer 140, as discussed above. In accordance with some embodiments, etching of dummy gate layer 130 can be done, for example, using a wet etch process, a dry etch process, and/or any combination thereof. As will be appreciated in light of this disclosure, the etch process(es) utilized in etching dummy gate layer 130 may depend, at least in part, on the material composition of layer 130 and/or other layers of IC 100. In any such case, the dimensions and amount of isotropy/anisotropy of a given recess 105 can be customized as desired for a given target application or end-use. As will be further appreciated, it may be desirable to ensure that the geometry (e.g., dimensions and/or isotropy/anisotropy) of a given recess 105 is suitable, for example, for a given contact architecture that is to be implemented (e.g., such as that discussed below with general reference to FIGS. 5-8). Other suitable etch processes for etching dummy gate layer 130 will depend on a given application and will be apparent in light of this disclosure.

Figure 3:
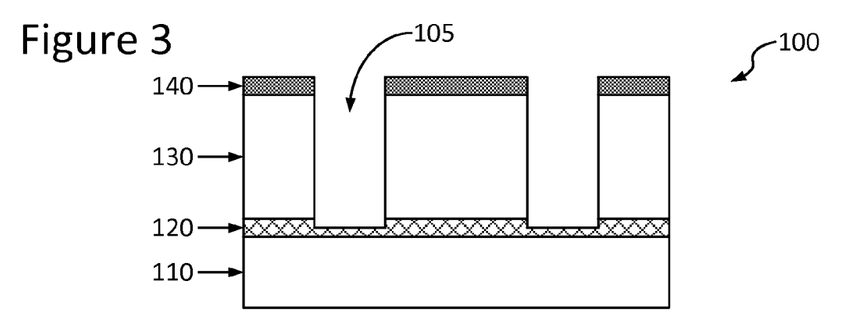
FIG. 3 is a cross-sectional side view of the IC of FIG. 2 after further etching thereof, in accordance with an embodiment.

The process flow continues as in FIG. 3, which is a cross-sectional side view of the IC 100 of FIG. 2 after further etching thereof, in accordance with an embodiment. As can be seen, as a result of the etching process, the one or more recesses 105 originally formed during etching of dummy gate layer 130 are extended into DGO layer 120. In accordance with some embodiments, etching of DGO layer 120 can be done, for example, using a wet etch process, a dry etch process, and/or any combination thereof. In some cases, the etch process that is utilized to etch DGO layer 120 can be a continuation of the etch process utilized in etching dummy gate layer 130, as discussed above. In some other cases, however, a separate or otherwise distinct etch process can be used; for instance, in some example embodiments, etching of dummy gate layer 130 can cease, selective patterning of DGO layer 120 can be performed, and a subsequent etch process can be used to etch DGO layer 120. In any case, the etch process(es) utilized in etching DGO layer 120 may depend, at least in part, on the material composition of DGO layer 120 and/or other layers of IC 100, as will be appreciated in light of this disclosure. Other suitable etch processes for etching DGO layer 120 to extend a given recess 105 will depend on a given application and will be apparent in light of this disclosure.

In some embodiments, DGO layer 120 initially may undergo only a partial etching so as to thin or otherwise reduce the thickness of DGO layer 120 in a given region thereof; that is, the full thickness of DGO layer 120 is not etched away, and so a given recess 105 may be made to initially terminate within, but not extend completely through, DGO layer 120 (e.g., such as is generally shown in FIG. 3). However, in other instances, etching through the full thickness of DGO layer 120 may be performed; that is, a given recess 105 can be made to extend completely through DGO layer 120 from surface to surface thereof without the aforementioned intermediate thinning. As discussed below with reference to FIG. 4, and in accordance with an embodiment, the degree of thinning/etch-through which DGO layer 120 undergoes can affect the final depth ($\delta$) that a given recess 105 extends into substrate 110. Also, as previously noted, by selectively thinning or removing the DGO layer 120, the gate layer 130 etch can be controlled to break into the diffusion layer, thereby creating a recess 105 as described herein. Numerous configurations will be apparent in light of this disclosure.

Figure 4:
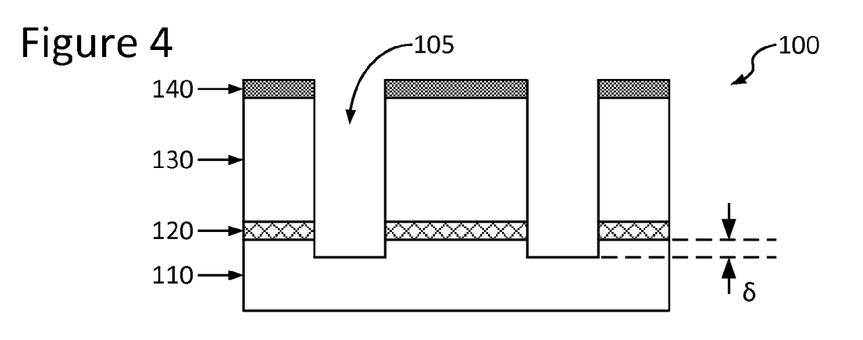
FIG. 4 is a cross-sectional side view of the IC of FIG. 3 after further etching thereof, in accordance with an embodiment.

The process flow continues as in FIG. 4, which is a cross-sectional side view of the IC 100 of FIG. 3 after further etching thereof, in accordance with an embodiment. As can be seen, as a result of the etching process, the one or more recesses 105 are further extended into substrate 110. In accordance with some embodiments, etching of substrate 110 can be done, for example, using a wet etch process, a dry etch process, and/or any combination thereof. As will be further appreciated in light of this disclosure, the etch process(es) utilized in etching substrate 110 may depend, at least in part, on the material composition of substrate 110 and/or other layers of IC 100. Other suitable etch processes for etching substrate 110 to further extend a given recess 105 will depend on a given application and will be apparent in light of this disclosure.

As previously noted in the context of FIG. 3, the final depth $\delta$ that a given recess 105 extends into substrate 110 can be affected, for example, by the degree of etching (e.g., partial or full) which DGO layer 120 undergoes. For instance, and in accordance with some embodiments, partially etching DGO layer 120 may result in a recess 105 which extends into substrate 110 to a depth $\delta$ that is less than or equal to about 100 nm (e.g., in the range of about 1-20 nm, about 20-50 nm, about 50-80 nm, about 80-100 nm, or any other sub-range that is less than or equal to about 100 nm). Conversely, and in accordance with some other embodiments, fully etching DGO layer 120 may result in a recess 105 which extends into substrate 110 to a depth δ that is in the range of about 100-300 nm or greater (e.g., in the range of about 100-150 nm, about 150-200 nm, about 200-250 nm, about 250-300 nm, or any other sub-range that is in the range of about 100-300 nm or greater). In a more general sense, the depth δ that a given recess 105 extends into substrate 110 can be tuned by adjusting the degree of thinning of DGO layer 120, as desired for a given target application or end-use. As will be appreciated in light of this disclosure, other dimensions and the degree of isotropy/anisotropy of a given recess 105 also may be customized, as desired. As will be further appreciated, it may be desirable to ensure that the final geometry of a given recess 105 is suitable, for example, for a given contact architecture that is to be implemented (e.g., such as that discussed below with general reference to FIGS. 5-8).

In some instances, the desired stopping point for etching substrate 110 (e.g., the desired depth δ of a given recess 105) may depend, at least in part, on the desired electrical properties/performance of IC 100. For example, and in accordance with an embodiment, as the depth δ that a given recess 105 extends into substrate 110 is increased, the junction leakage ($L_b$) exhibited by IC 100 decreases and its threshold voltage ($V_T$) increases. Also, and in accordance with some embodiments, increasing the depth δ of a given recess 105 may improve the reliability of IC 100, for example, such as by increasing its breakdown voltage, increasing its output voltage, and/or improving its performance regarding hot carrier effects (HCEs). In one example embodiment in which substrate 110 is configured as a silicon (Si) fin, as much as a tenfold or higher (e.g., in the range of about 1-10× or greater) reduction in $L_b$ can be provided while simultaneously providing an increase in $V_T$ in the range of about 100 mV (e.g., ±25%), as compared with existing architectures. These and other considerations may make IC 100 desirable for use, for example, in low-power transistor-based architectures and devices. Other suitable uses will be apparent in light of this disclosure.

Figure 5:
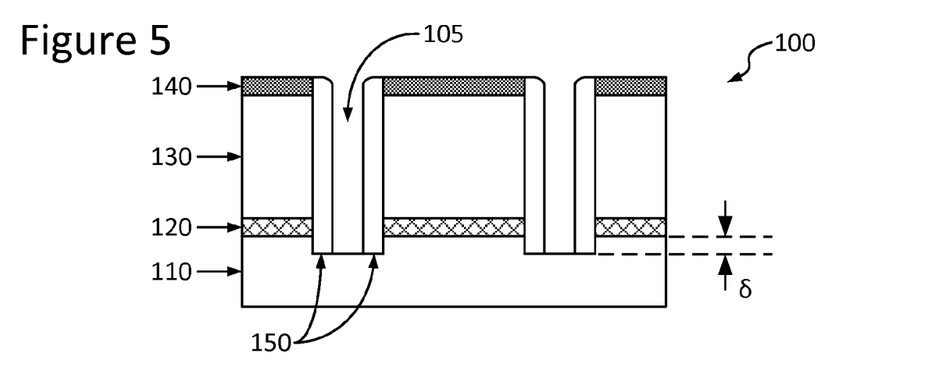
FIG. 5 is a cross-sectional side view of the IC of FIG. 4 after forming a recessed spacer, in accordance with an embodiment.

The process flow continues as in FIG. 5, which is a cross-sectional side view of the IC 100 of FIG. 4 after forming recessed spacer 150, in accordance with an embodiment. Spacer 150 can be formed, for example, along the sidewalls of a given recess 105 (e.g., can be made to extend from hardmask 140 to the bottom of recess 105 in substrate 110). In this sense, spacer 150 may be referred to as a recessed spacer. Spacer 150 can be provided with any thickness, as desired for a given target application or end-use; however, it may be desirable to ensure that the thickness of spacer 150 is not so excessive as to occlude or otherwise obstruct recess 105 from receiving a given contact architecture that is to be implemented (e.g., spacer 150, region 160, fill 170, and contact 190, each discussed in turn below). To that end, spacer 150 can be formed, for example, using any of a wide variety of processes, including: chemical vapor deposition (CVD); atomic layer deposition (ALD); and/or any combination thereof. Also, in some embodiments, spacer 150 can comprise, for example, a nitride such as silicon nitride (Si3N4) and/or any other suitable spacer material, as will be apparent in light of this disclosure. Other suitable configurations, materials, and techniques for forming spacer 150 will depend on a given application and will be apparent in light of this disclosure.

Figure 6:
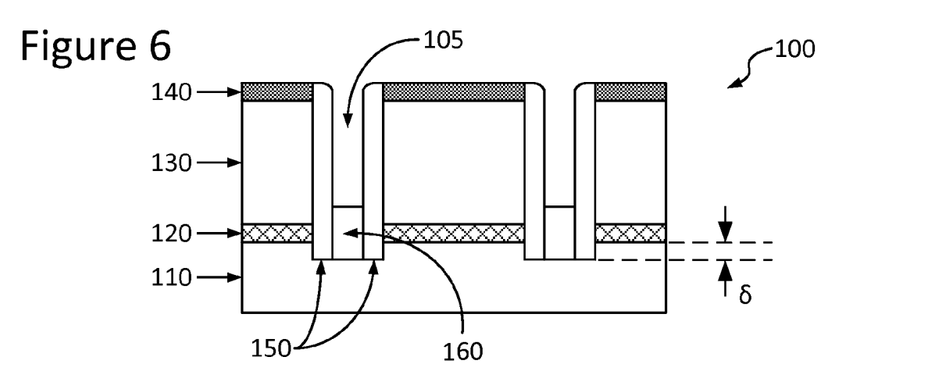
FIG. 6 is a cross-sectional side view of the IC of FIG. 5 after forming recessed source/drain (S/D) regions, in accordance with an embodiment.

The process flow continues as in FIG. 6, which is a cross-sectional side view of the IC 100 of FIG. 5 after forming recessed source/drain (S/D) regions 160, in accordance with an embodiment. FIG. 6' is a cross-sectional perspective view of the IC of FIG. 6, and FIG. 6" is a cross-sectional view taken along dotted line A-A in FIG. 6'. As can be seen, S/D regions 160 can be formed, for example, within a given recess 105 in the space remaining after formation of spacer 150, and hence may be referred to as recessed S/D regions. A given S/D region 160 can be provided with any thickness/height, as desired for a given target application or end-use; however, it may be desirable to ensure that a given S/D region 160 is not so excessive in dimensions as to prevent or otherwise hinder recess 105 from receiving the desired contact architecture. To that end, a given S/D region 160 can be formed, for example, using any of a wide variety of processes, including: epitaxy; atomic layer deposition (ALD); and/or any combination thereof. Also, in some embodiments, a given S/D region 160 can comprise, for example: silicon (Si); silicon germanium (SiGe); silicon carbide (SiC); and/or any other suitable S/D region material, as will be apparent in light of this disclosure. Other suitable configurations, materials, and techniques for forming a given S/D region 160 will depend on a given application and will be apparent in light of this disclosure.

As can further be seen, a shallow trench isolation (STI) layer 125 can be provided over substrate 110. In accordance with an embodiment, STI layer 125 can be provided over substrate 110 with any desired initial thickness. To that end, STI layer 125 can be formed using any of a wide variety of techniques, including: high-density plasma (HDP) chemical vapor deposition (CVD); spin coating/spin-on deposition (SOD); and/or any combination thereof. In some instances, it may be desirable to reduce the thickness of the STI layer 125 such that it is recessed below the height of the fins of substrate 110. To this end, and in accordance with an embodiment, any suitable wet and/or dry etch process can be used, as will be apparent in light of this disclosure. As will be further appreciated, the degree to which STI layer 125 is recessed can be customized, as desired. Also, in some embodiments, STI layer 125 can comprise, for example, an oxide such as silicon dioxide ($SiO_2$). However, STI layer 125 is not so limited in material composition, as in a more general sense, STI layer 125 may be any insulator material which provides the desired amount of electrical isolation for a given target application or end-use, as will be apparent in light of this disclosure. Other suitable materials, configurations, and techniques for providing and recessing STI layer 125 will depend on a given application and will be apparent in light of this disclosure.

Figure 7:
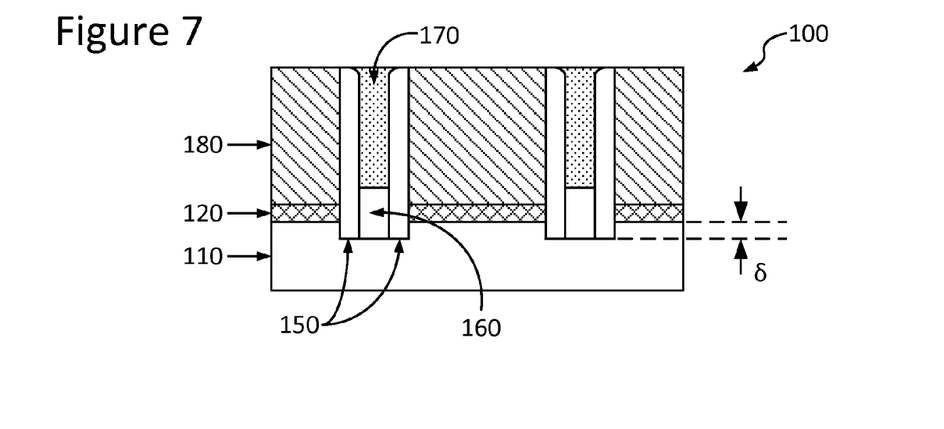
FIG. 7 is a cross-sectional side view of the IC of FIG. 6 after providing an inter-layer dielectric (ILD) fill and forming replacement metal gates (RMGs), in accordance with an embodiment.

The process flow continues as in FIG. 7, which is a cross-sectional side view of the IC 100 of FIG. 6 after providing an inter-layer dielectric (ILD) fill 170 and forming replacement metal gates (RMGs) 180, in accordance with an embodiment. As can be seen, the one or more recesses 105 of IC 100 can receive an ILD fill material 170. ILD 170 can be provided, for example, using any of a wide variety of processes, including: high-density plasma (HDP) chemical vapor deposition (CVD); spin coating/spin-on deposition (SOD); and/or any combination thereof. Also, in some embodiments, ILD 170 can comprise, for example, an oxide such as silicon dioxide ($SiO_2$) and/or any other material which can serve as an ILD, as will be apparent in light of this disclosure. Other suitable configurations, materials, and techniques for forming ILD 170 will depend on a given application and will be apparent in light of this disclosure.

Also, as can be seen, hardmask layer 140 and dummy gate layer 130 can be removed from IC 100. Removal of hardmask layer 140 and dummy gate layer 130 can be done using any suitable etch, polish, and/or clean process, as will be apparent in light of this disclosure. As previously noted, DGO layer 120 may serve as an etch stop, for example, during the removal of dummy gate layer 130.

As can further be seen, one or more RMGs 180 may be formed in the regions available after removing dummy gate layer 130; thus, as previously noted, dummy gate layer 130 may serve as a sacrificial layer, in accordance with an embodiment. A given RMG 180 can be provided with any dimensions, as desired for a given target application or end-use. To that end, a given RMG 180 can be formed, for example, using any of a wide variety of processes, including: physical vapor deposition (PVD), such as sputtering or evaporation; chemical vapor deposition (CVD); a metal deposition process; and/or any combination thereof. Also, in some embodiments, a given RMG 180 can comprise any of a wide range of materials, such as: tungsten (W); aluminum (Al); titanium (Ti); copper (Cu); an alloy of any thereof, and/or any other suitably electrically conductive material, as will be apparent in light of this disclosure. Other suitable configurations, materials, and processes for forming a given RMG 180 will depend on a given application and will be apparent in light of this disclosure.

Figure 8:
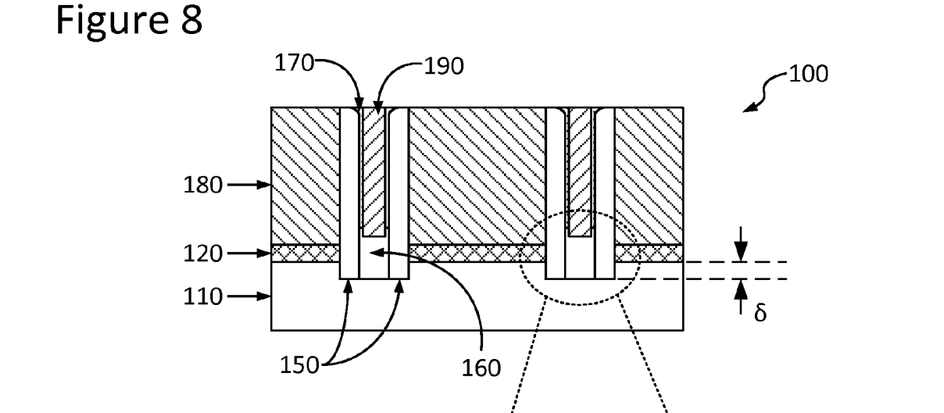
FIG. 8 is a cross-sectional side view of the IC of FIG. 7 after forming S/D contacts, in accordance with an embodiment.

The process flow continues as in FIG. 8, which is a cross-sectional side view of the IC 100 of FIG. 7 after forming source/drain (S/D) contacts 190, in accordance with an embodiment. As can be seen, a given S/D contact 190 can be formed, for example, within a recess 105 (e.g., which further may include spacer 150, a S/D region 160, and/or an ILD fill 170, as previously discussed). In some instances, during formation, a given S/D contact 190 may become inserted or otherwise partially embedded in a corresponding S/D region 160, such as is generally depicted in FIG. 8', which is an expanded view of the portion of FIG. 8 enclosed by the dashed ellipse contained therein. In some cases, a given S/D contact 190 may be dimensioned such that it comes into physical contact with the adjacent spacer 150. However, in other cases, a portion of ILD 170 may remain intact between a given contact 190 and the adjacent spacer 150 (e.g., such as can be seen in FIG. 8'). In any such case, a given S/D contact 190 can be formed, for example, using any of a wide range of processes, including: physical vapor deposition (PVD), such as sputtering; electroplating; and/or any combination thereof. Also, and in accordance with one or more embodiments, a given S/D contact 190 can comprise any of the same materials discussed above, for example, with regard to RMGs 180. Other suitable configurations, materials, and techniques for forming a given S/D contact 190 will depend on a given application and will be apparent in light of this disclosure.

Figure 9:
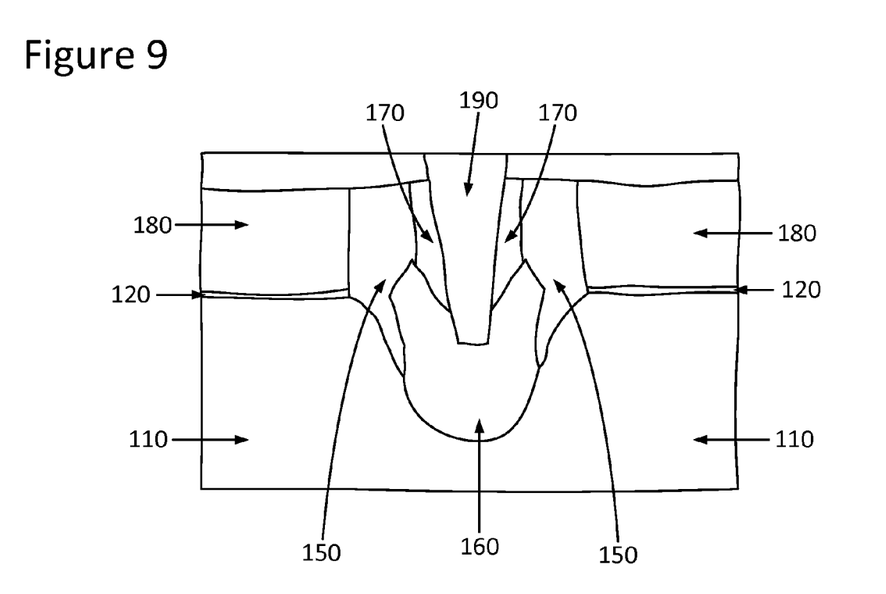
FIG. 9 is a cross-sectional side view of an actual example IC configured in accordance with an embodiment.

FIG. 9 illustrates a cross-sectional side view of an actual example IC configured in accordance with an embodiment. As can be seen, spacer 150 and S/D implant region 160 are recessed within substrate 110, as previously discussed.

Example System

Figure 10:
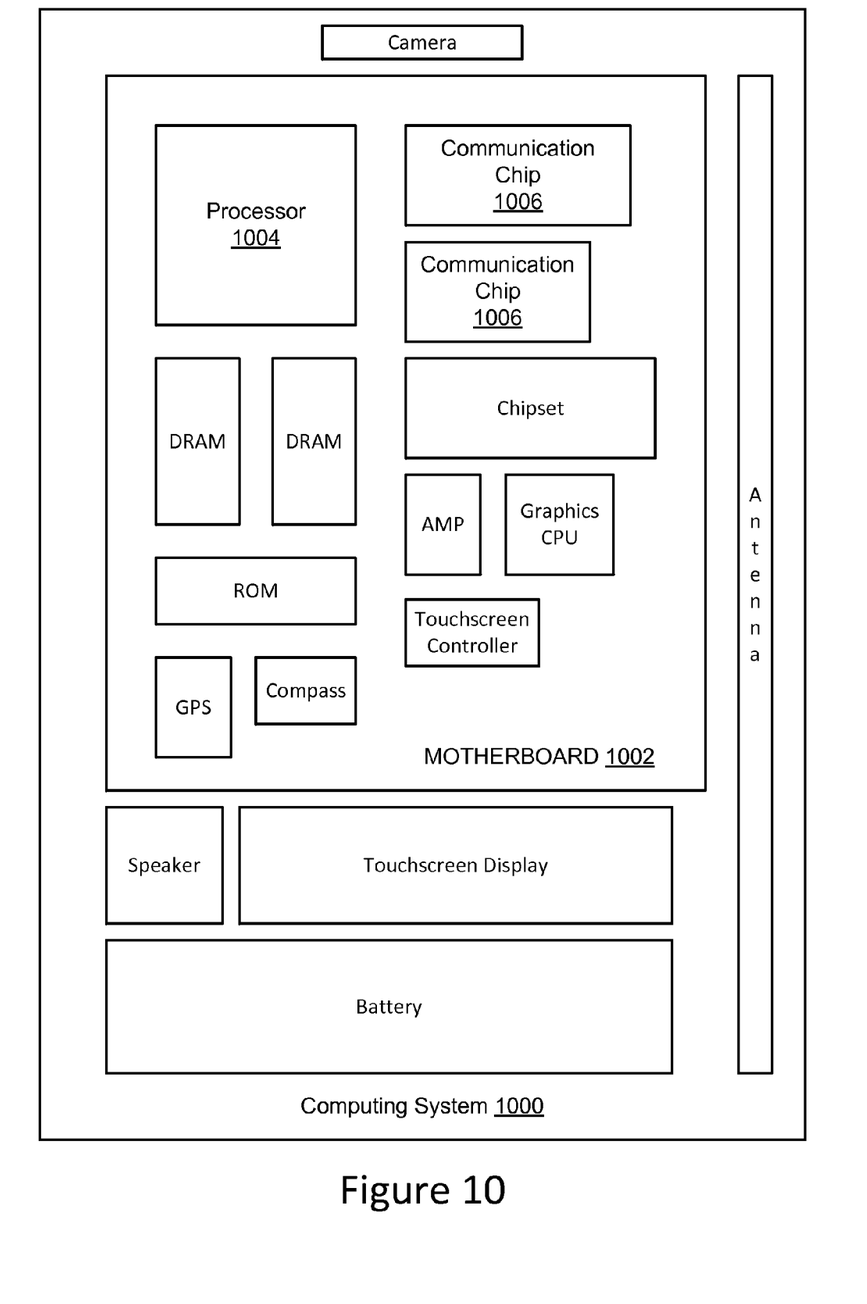
FIG. 10 illustrates a computing system implemented with integrated circuit structures or devices formed using the disclosed techniques in accordance with an example embodiment.

FIG. 10 illustrates a computing system 1000 implemented with integrated circuit structures or devices formed using the disclosed techniques in accordance with an example embodiment. As can be seen, the computing system 1000 houses a motherboard 1002. The motherboard 1002 may include a number of components, including, but not limited to, a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, etc. Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures or devices formed using the disclosed techniques in accordance with an example embodiment. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA. DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments, the integrated circuit die of the processor includes onboard circuitry that is implemented with one or more integrated circuit structures or devices formed using the disclosed techniques, as variously described herein. The term "processor" may refer to any device or portion of a device that processes, for instance, electronic data from registers and/or memory to transform that electronic data into other electronic data that may be stored in registers and/or memory.

The communication chip 1006 also may include an integrated circuit die packaged within the communication chip 1006. In accordance with some such example embodiments, the integrated circuit die of the communication chip includes one or more integrated circuit structures or devices formed by using the IC fabrication techniques as described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing device 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

Further Example Embodiments

The following examples pertain to further embodiments, from which numerous permutations and configurations will be apparent.

Example 1 is an integrated circuit comprising: a semiconductor substrate; a gate oxide layer disposed over the semiconductor substrate; a gate metal layer disposed over a portion of the gate oxide layer; first and second recesses extending through the gate oxide layer and into the semiconductor substrate and adjacent to corresponding first and second sidewalls of the gate oxide layer and gate metal layer; first and second spacers disposed along the corresponding first and second sidewalls of the gate oxide layer and gate metal layer and extending into the first and second recesses, respectively; and source/drain (S/D) regions disposed within the first and second recesses, respectively.

Example 2 includes the subject matter of any of Examples 1 and 3 through 18, wherein the S/D regions comprise at least one of silicon (Si), silicon germanium (SiGe), and/or silicon carbide (SiC).

Example 3 includes the subject matter of any of Examples 1 through 2 and 4 through 18, wherein the S/D regions comprise epitaxial silicon (Si).

Example 4 includes the subject matter of any of Examples 1 through 3 and 5 through 18, wherein the gate oxide layer serves as a sacrificial layer.

Example 5 includes the subject matter of any of Examples 1 through 4 and 6 through 18 and further includes an inter-layer dielectric (ILD) disposed within the first and second recesses adjacent to the first and second spacers.

Example 6 includes the subject matter of any of Examples 1 through 5 and 7 through 18 and further includes first and second source/drain (S/D) contacts disposed within the first and second recesses, respectively.

Example 7 includes the subject matter of Example 6, wherein the first and second S/D contacts extend into the S/D regions disposed within the first and second recesses, respectively.

Example 8 includes the subject matter of any of Examples 1 through 7 and 9 through 18, wherein the first and second recesses extend into the semiconductor substrate a distance in the range of about 1-100 nm.

Example 9 includes the subject matter of any of Examples 1 through 8 and 10 through 18, wherein the first and second recesses extend into the semiconductor substrate a distance in the range of about 100-300 nm.

Example 10 includes the subject matter of any of Examples 1 through 9, 11, and 17 through 18, wherein the integrated circuit comprises a planar metal-oxide-semiconductor field-effect transistor (MOSFET).

Example 11 includes the subject matter of Example 10, wherein the first and second recesses are located in a region of the planar MOSFET which experiences junction leakage ($L_b$).

Example 12 includes the subject matter of any of Examples 1 through 9, 13, and 17 through 18, wherein the integrated circuit comprises a tri-gate metal-oxide-semiconductor field-effect transistor (MOSFET).

Example 13 includes the subject matter of Example 12, wherein the first and second recesses are located in a region of the tri-gate MOSFET which experiences junction leakage ($L_b$).

Example 14 includes the subject matter of any of Examples 1 through 9 and 15 through 18, wherein the integrated circuit comprises a fin-based field-effect transistor (finFET).

Example 15 includes the subject matter of Example 14, wherein the first and second recesses are located in a region of the finFET which experiences gate-induced drain leakage (GIDL).

Example 16 includes the subject matter of Example 14, wherein the semiconductor substrate comprises a fin of the finFET, and wherein the first and second recesses extend into a top portion of the fin.

Example 17 includes the subject matter of any of Examples 1 through 16 and 18, wherein the integrated circuit exhibits at least one of reduced junction leakage ($L_b$) and/or increased threshold voltage ($V_T$).

Example 18 includes the subject matter of any of Examples 1 through 17, wherein the integrated circuit exhibits at least one of improved breakdown voltage, improved output voltage, and/or improved hot carrier effect (HCE) performance.

Example 19 is a system-on-chip (SoC) comprising the integrated circuit of any of Examples 1 through 18.

Example 20 is an embedded segment comprising the integrated circuit of any of Examples 1 through 18.

Example 21 is a portable computing device comprising the integrated circuit of any of Examples 1 through 18.

Example 22 includes the subject matter of Example 21, wherein the portable computing device comprises at least one of a laptop computer, a netbook, a notebook computer, an ultra-mobile personal computer, a smartphone, a mobile phone, a tablet, a personal digital assistant (PDA), a portable music player (PMP), and/or a digital camera.

Example 23 is a method of forming an integrated circuit, the method comprising: forming a gate oxide layer over a semiconductor substrate; forming a gate layer over the gate oxide layer; forming first and second recesses adjacent to corresponding first and second sidewalls of the gate oxide layer and gate layer, each recess extending through the gate oxide layer and into the semiconductor substrate; forming first and second spacers within the first and second recesses, respectively, the spacers extending along the corresponding first and second sidewalls of the gate oxide layer and gate layer and into the semiconductor substrate; and forming source/drain (S/D) regions within the first and second recesses, respectively, the regions extending into the semiconductor substrate.

Example 24 includes the subject matter of any of Examples 23 and 25 through 34, wherein forming the gate oxide layer over the semiconductor substrate comprises using at least one of a thermal growth process, an atomic layer deposition (ALD) process, a chemical vapor deposition (CVD) process, and/or any combination thereof.

Example 25 includes the subject matter of any of Examples 23 through 24 and 26 through 34, wherein forming the gate layer over the gate oxide layer comprises using at least one of a physical vapor deposition (PVD) process, a sputtering process, an evaporation process, a chemical vapor deposition (CVD) process, a metal deposition process, and/or any combination thereof.

Example 26 includes the subject matter of any of Examples 23 through 25 and 27 through 34, wherein forming the first and second recesses comprises using an etching process.

Example 27 includes the subject matter of any of Examples 23 through 26 and 28 through 34, wherein forming the first and second spacers within the first and second recesses comprises using at least one of a chemical vapor deposition (CVD) process, an atomic layer deposition (ALD) process, and/or any combination thereof.

Example 28 includes the subject matter of any of Examples 23 through 27 and 29 through 34, wherein forming the S/D regions comprises using at least one of an epitaxy process, an atomic layer deposition (ALD) process, and/or any combination thereof.

Example 29 includes the subject matter of any of Examples 23 through 28 and 30 through 34, wherein before forming the gate layer over the gate oxide layer, the method further comprises: forming a dummy gate layer over the gate oxide layer, the dummy gate layer being replaced subsequently by the gate layer.

Example 30 includes the subject matter of Example 29, wherein forming the dummy gate layer over the gate oxide layer comprises using at least one of a chemical vapor deposition (CVD) process, an epitaxy process, a liquid-phase epitaxy (LPE) process, and/or any combination thereof.

Example 31 includes the subject matter of any of Examples 23 through 30 and 32 through 34, wherein the method further comprises: disposing an inter-layer dielectric (ILD) within the first and second recesses.

Example 32 includes the subject matter of Example 31, wherein disposing the ILD within the first and second recesses comprises using at least one of a high-density plasma (HDP) chemical vapor deposition (CVD) process, a spin coating/spin-on deposition (SOD) process, and/or any combination thereof.

Example 33 includes the subject matter of any of Examples 23 through 32 and 34, wherein the method further comprises: forming first and second source/drain (S/D) contacts within the first and second recesses, respectively, wherein each of the first and second S/D contacts is at least partially embedded in the S/D regions within the first and second recesses, respectively.

Example 34 includes the subject matter of Example 33, wherein forming the first and second S/D contacts within the first and second recesses comprises using at least one of a physical vapor deposition (PVD) process, a sputtering process, an electroplating process, and/or any combination thereof.

Example 35 is a metal-oxide-semiconductor (MOS) process flow comprising the method of any of Examples 23 through 34.

Example 36 is a transistor formed by the process flow of Example 35.

Example 37 is a complementary metal-oxide-semiconductor (CMOS) process flow comprising the method of any of Examples 23 through 34.

Example 38 is a transistor formed by the process flow of Example 37.

Example 39 is an integrated circuit formed by the method of any of Examples 23 through 34.

Example 40 is a system-on-chip (SoC) comprising the integrated circuit of Example 39.

Example 41 is an embedded segment comprising the integrated circuit of Example 39.

Example 42 is a portable computing device comprising the integrated circuit of Example 39.

Example 43 includes the subject matter of Example 42, wherein the portable computing device comprises at least one of a laptop computer, a netbook, a notebook computer, an ultra-mobile personal computer, a smartphone, a mobile phone, a tablet, a personal digital assistant (PDA), a portable music player (PMP), and/or a digital camera.

Example 44 is a transistor comprising: a semiconductor substrate having a first and second recess formed in a surface thereof, the recesses extending into the semiconductor substrate; a gate body formed over the surface of the semiconductor substrate and adjacent to and between the first and second recesses; first and second spacers disposed along corresponding first and second sidewalls of the gate body and extending into the first and second recesses, respectively; and first and second source/drain (S/D) architectures formed adjacent to the gate body, wherein the first and second S/D architectures are disposed at least partially within the first and second recesses, respectively.

Example 45 includes the subject matter of Example 44, wherein each of the first and second S/D architectures comprises: a S/D region; and a S/D contact at least partially embedded in the S/D region.

Example 46 includes the subject matter of Example 45, wherein the S/D region comprises at least one of silicon (Si), silicon germanium (SiGe), and/or silicon carbide (SiC).

Example 47 includes the subject matter of Example 45, wherein the S/D region comprises epitaxial silicon (Si).

Example 48 includes the subject matter of Example 45, wherein each of the first and second S/D architectures further comprises an inter-layer dielectric (ILD), wherein the S/D contact is at least partially disposed within the ILD.

Example 49 includes the subject matter of any of Examples 44 through 48 and 50 through 63 and further includes a gate oxide layer disposed between the gate body and the semiconductor substrate and adjacent to and between the first and second recesses.

Example 50 includes the subject matter of any of Examples 44 through 49 and 52 through 63, wherein each of the first and second recesses has an anisotropic geometry.

Example 51 includes the subject matter of any of Examples 44 through 49 and 52 through 63, wherein each of the first and second recesses has an isotropic geometry.

Example 52 includes the subject matter of any of Examples 44 through 51 and 60 through 63, wherein each of the first and second recesses extends into the semiconductor substrate to a depth in the range of about 1-20 nm.

Example 53 includes the subject matter of any of Examples 44 through 51 and 60 through 63, wherein each of the first and second recesses extends into the semiconductor substrate to a depth in the range of about 20-50 nm.

Example 54 includes the subject matter of any of Examples 44 through 51 and 60 through 63, wherein each of the first and second recesses extends into the semiconductor substrate to a depth in the range of about 50-80 nm.

Example 55 includes the subject matter of any of Examples 44 through 51 and 60 through 63, wherein each of the first and second recesses extends into the semiconductor substrate to a depth in the range of about 80-100 nm.

Example 56 includes the subject matter of any of Examples 44 through 51 and 60 through 63, wherein each of the first and second recesses extends into the semiconductor substrate to a depth in the range of about 100-150 nm.

Example 57 includes the subject matter of any of Examples 44 through 51 and 60 through 63, wherein each of the first and second recesses extends into the semiconductor substrate to a depth in the range of about 150-200 nm.

Example 58 includes the subject matter of any of Examples 44 through 51 and 60 through 63, wherein each of the first and second recesses extends into the semiconductor substrate to a depth in the range of about 200-250 nm.

Example 59 includes the subject matter of any of Examples 44 through 51 and 60 through 63, wherein each of the first and second recesses extends into the semiconductor substrate to a depth in the range of about 250-300 nm.

Example 60 includes the subject matter of any of Examples 44 through 59, wherein the transistor is configured as a planar metal-oxide-semiconductor field-effect transistor (MOSFET).

Example 61 includes the subject matter of any of Examples 44 through 59, wherein the transistor is configured as a tri-gate metal-oxide-semiconductor field-effect transistor (MOSFET).

Example 62 includes the subject matter of any of Examples 44 through 59, wherein the transistor is configured as a fin-based field-effect transistor (finFET).

Example 63 includes the subject matter of Example 62, wherein the semiconductor substrate comprises a fin of the finFET, and wherein the surface having the first and second recesses formed therein comprises a top portion of the fin, the first and second recesses extending into the fin.

The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future-filed applications claiming priority to this application may claim the disclosed subject matter in a different manner and generally may include any set of one or more limitations as variously disclosed or otherwise demonstrated herein.

What is claimed is:

1. An integrated circuit comprising:
a semiconductor substrate;
a gate oxide layer disposed over the semiconductor substrate;
a gate metal layer disposed over the gate oxide layer;
first and second recesses extending through the gate metal layer and gate oxide layer and into the semiconductor substrate, adjacent to corresponding first and second sidewalls of the gate oxide layer and gate metal layer;
first and second spacers disposed within the first and second recesses, respectively, along the corresponding first and second sidewalls, respectively, of the gate oxide layer and gate metal layer and extending into the semiconductor substrate below a plane of the gate oxide layer, wherein the first and second spacers are in physical contact with the semiconductor substrate; and
source/drain (S/D) regions disposed within the first and second recesses, respectively, adjacent the first and second spacers, respectively, and extending from within the semiconductor substrate to alongside the first and second sidewalls, respectively, of the gate metal layer.

2. The integrated circuit of claim 1, wherein the S/D regions comprise at least one of silicon (Si), silicon germanium (SiGe), and silicon carbide (SiC).

3. The integrated circuit of claim 1, wherein the S/D regions comprise epitaxial silicon (Si).

4. The integrated circuit of claim 1 further comprising an inter-layer dielectric (ILD) disposed within the first and second recesses adjacent to the first and second spacers.

5. The integrated circuit of claim 1 further comprising first and second source/drain (S/D) contacts disposed within the first and second recesses, respectively, wherein the first and second S/D contacts extend into the S/D regions disposed within the first and second recesses, respectively.

6. The integrated circuit of claim 1, wherein the first and second recesses extend into the semiconductor substrate a distance in the range of about 1-100 nm.

7. The integrated circuit of claim 1, wherein the first and second recesses extend into the semiconductor substrate a distance in the range of about 100-300 nm.

8. The integrated circuit of claim 1, wherein the integrated circuit comprises a planar metal-oxide-semiconductor field-effect transistor (MOSFET), and wherein the first and second recesses are located in a region of the planar MOSFET which experiences junction leakage ($L_b$).

9. The integrated circuit of claim 1, wherein the integrated circuit comprises a tri-gate metal-oxide-semiconductor field-effect transistor (MOSFET), and wherein the first and second recesses are located in a region of the tri-gate MOSFET which experiences junction leakage ($L_b$).

10. The integrated circuit of claim 1, wherein the integrated circuit comprises a fin-based field-effect transistor (finFET), and wherein the first and second recesses are located in a region of the finFET which experiences gate-induced drain leakage (GIDL).

11. The integrated circuit of claim 10, wherein the semiconductor substrate comprises a fin of the finFET, and wherein the first and second recesses extend into a top portion of the fin.

12. A method of forming an integrated circuit, the method comprising:
forming a gate oxide layer over a semiconductor substrate;
forming a gate layer over the gate oxide layer;
forming first and second recesses adjacent to corresponding first and second sidewalls of the gate oxide layer and gate layer, each recess extending through the gate oxide layer and gate layer and into the semiconductor substrate;
forming first and second spacers within the first and second recesses, respectively, the spacers extending along the corresponding first and second sidewalls, respectively, of the gate oxide layer and gate layer and into the semiconductor substrate below a plane of the gate oxide layer, wherein the first and second spacers are in physical contact with the semiconductor substrate; and
forming source/drain (S/D) regions within the first and second recesses, respectively, the S/D regions adjacent the first and second spacers, respectively, and extending from within the semiconductor substrate to alongside the first and second sidewalls, respectively, of the gate metal layer.

13. The method of claim 12, wherein before forming the gate layer over the gate oxide layer, the method further comprises:

forming a dummy gate layer over the gate oxide layer, the dummy gate layer being replaced subsequently by the gate layer.

14. The method of claim 12 further comprising:
disposing an inter-layer dielectric (ILD) within the first and second recesses.

15. The method of claim 12 further comprising:
forming first and second source/drain (S/D) contacts within the first and second recesses, respectively, wherein each of the first and second S/D contacts is at least partially embedded in the S/D regions within the first and second recesses, respectively.

16. An integrated circuit formed by the method of claim 12.

17. A system-on-chip (SoC) comprising the integrated circuit of claim 16.

18. An embedded segment comprising the integrated circuit of claim 16.

19. A portable computing device comprising the integrated circuit of claim 16.

20. The portable computing device of claim 19, wherein the portable computing device comprises at least one of a laptop computer, a netbook, a notebook computer, an ultra-mobile personal computer, a smartphone, a mobile phone, a tablet, a personal digital assistant (PDA), a portable music player (PMP), and a digital camera.

21. A transistor comprising:
a semiconductor substrate having a first and second recess formed in a surface thereof, the recesses extending into the semiconductor substrate;
a gate body formed over the surface of the semiconductor substrate and adjacent to and between the first and second recesses;
a gate oxide layer disposed between the gate body and the semiconductor substrate and adjacent to and between the first and second recesses;
first and second spacers disposed along corresponding first and second sidewalls of the gate body and extending into the first and second recesses, respectively, below a plane of the gate oxide layer, wherein the first and second spacers are in physical contact with the semiconductor substrate; and
first and second source/drain (S/D) architectures formed adjacent to the gate body, wherein the first and second S/D architectures are disposed at least partially within the first and second recesses, respectively, such that they extend from within the semiconductor substrate to alongside the first and second sidewalls, respectively, of the gate body.

22. The transistor of claim 21, wherein each of the first and second S/D architectures comprises:
a S/D region;
an inter-layer dielectric (ILD) disposed over the S/D region; and
a S/D contact at least partially embedded in the S/D region and at least partially disposed within the ILD.

23. The transistor of claim 21, wherein the S/D region comprises at least one of silicon (Si), silicon germanium (SiGe), and silicon carbide (SiC).

24. The transistor of claim 21, wherein the first and second recesses extend into the semiconductor substrate a distance in the range of about 1-300 nm.

25. The transistor of claim 21, wherein the transistor is configured as a fin-based field-effect transistor (finFET), the semiconductor substrate comprises a fin of the finFET, and the surface having the first and second recesses formed therein comprises a top portion of the fin, the first and second recesses extending into the fin.

* * * * *